United States Patent
Cho et al.

(10) Patent No.: US 8,354,142 B2
(45) Date of Patent: *Jan. 15, 2013

(54) METHOD FOR COATING POLYIMIDE LAYER USING INKJET DEVICE

(75) Inventors: Ki Du Cho, Gyeongsangbuk-do (KR); Bong Chul Kim, Daegu (KR); Hui Jae Lee, Daejeon (KR); Sun Ja Kim, Daegu (KR); Hwang Un Seo, Busan (KR); Hang Sup Cho, Chungcheongnam-do (KR); Eun Mi Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/691,362

(22) Filed: Jan. 21, 2010

(65) Prior Publication Data
US 2010/0119723 A1   May 13, 2010

Related U.S. Application Data

(62) Division of application No. 11/647,231, filed on Dec. 29, 2006, now Pat. No. 7,673,580.

(30) Foreign Application Priority Data

Mar. 29, 2006   (KR) .................. 10-2006-0028401

(51) Int. Cl.
    *B05D 5/00* (2006.01)
(52) U.S. Cl. ...................................... 427/256
(58) Field of Classification Search .................. 347/33; 427/256; 118/302
    See application file for complete search history.

(56) References Cited

U.S. PATENT DOCUMENTS

| 5,051,758 | A | | 9/1991 | Markham |
| 5,448,271 | A | * | 9/1995 | Yamaguchi et al. ............ 347/30 |
| 5,631,678 | A | | 5/1997 | Hadimioglu et al. |
| 5,670,996 | A | | 9/1997 | Mitani |
| 5,745,133 | A | | 4/1998 | Hendricks et al. |
| 5,847,727 | A | | 12/1998 | VanLiew et al. |
| 5,914,734 | A | | 6/1999 | Rotering et al. |
| 6,084,608 | A | * | 7/2000 | Harvey et al. .................. 347/33 |
| 6,241,337 | B1 | | 6/2001 | Sharma et al. |
| 6,312,090 | B1 | * | 11/2001 | Griffin et al. .................. 347/28 |
| 6,318,837 | B1 | * | 11/2001 | Barinaga ........................ 347/33 |
| 6,394,596 | B1 | | 5/2002 | Wotton et al. |

(Continued)

FOREIGN PATENT DOCUMENTS

CN   1745903 A   3/2006

(Continued)

OTHER PUBLICATIONS

Korean Office Action (Application No. 10-2006-0028401), dated Sep. 26, 2012.

*Primary Examiner* — Frederick Parker
*Assistant Examiner* — Alex A Rolland
(74) *Attorney, Agent, or Firm* — Morgan, Lewis & Bockius LLP (57) ABSTRACT

A method for coating a polyimide layer includes, placing a substrate on a print table; jetting polyimide liquid onto the substrate from a jetting surface provided over the print table; and wiping the jetting surface by moving a wiper from one side of the jetting surface to another side of the jetting surface while the wiper contacts the jetting surface, wherein the wiper is made of one of a perfluoro-based polymer.

5 Claims, 7 Drawing Sheets

U.S. PATENT DOCUMENTS

| | | |
|---|---|---|
| 6,497,472 B2 | 12/2002 | Sharma et al. |
| 6,959,978 B2 * | 11/2005 | Chang .............................. 347/33 |
| 7,438,384 B2 * | 10/2008 | Byun et al. ....................... 347/33 |
| 2003/0076378 A1 | 4/2003 | Nakamura et al. |
| 2003/0165629 A1* | 9/2003 | Sakurada ....................... 427/421 |
| 2004/0113971 A1 | 6/2004 | Nakajima |
| 2004/0169805 A1* | 9/2004 | Yun et al. ....................... 349/124 |
| 2005/0062796 A1 | 3/2005 | Mott et al. |
| 2005/0118351 A1 | 6/2005 | Miura |
| 2005/0271832 A1 | 12/2005 | Goto |
| 2006/0209118 A1 | 9/2006 | Nakajima |

FOREIGN PATENT DOCUMENTS

| | | |
|---|---|---|
| JP | 7-25016 | 1/1995 |
| JP | 7-89092 | 4/1995 |
| JP | 7-266570 | 10/1995 |
| JP | 8-150710 | 6/1996 |
| JP | 2000-141671 | 5/2000 |
| JP | 2004-188903 | 7/2004 |
| JP | 2005-134466 | 5/2005 |
| JP | 2005-316277 | 11/2005 |
| KR | 20030035892 A | 5/2003 |

* cited by examiner

METHOD FOR COATING POLYIMIDE LAYER USING INKJET DEVICE

This application is a Divisional of application Ser. No. 11/647,231, filed Dec. 29, 2006, now U.S. Pat. No. 7,673,580. This invention claims the benefit of Korean Patent Application No. 10-2006-0028401 filed in Korea on Mar. 29, 2006, which is hereby incorporated by reference in its entitety.

BACKGROUND OF THE INVENTION

1. Field of the Invention

Embodiments of the invention relate to coating, and more particularly, to an apparatus and method for coating a polyimide layer.

2. Background of the Related Art

A liquid crystal display (LCD) device is an apparatus for displaying a desired image by adjusting quantity of light reaching a color filter substrate. The adjustment of the quantity of light is accomplished by changing intermolecular orientation of liquid crystal molecules interposed between a transparent insulating substrate serving as the color filter substrate and an array substrate. One type of LCD device is a thin film transistor liquid crystal display (TFT LCD) device, which uses thin film transistors (TFTs) as switching elements.

In general, an LCD device includes an LCD panel for displaying an image and a driver for driving the LCD panel by applying driving signals to the LCD panel. The LCD panel includes a color filter substrate and an array substrate bonded to each other with a predetermined gap therebetween. A layer of liquid crystal molecules is in the gap between the color filter substrate and the array substrate. The color filter substrate and the array substrate of the LCD panel are manufactured through a plurality of masking processes. Polyimide layers are formed on respective substrates after finishing the masking processes and before the substrates are bonded to each other. The polyimide layers are used as alignment films to arrange the liquid crystal molecules in a predetermined direction.

The polyimide layers can be coated on the substrates through a variety of methods, such as a spin-coating method, a spray-coating method, and an inkjet-coating method. Of the coating methods, the inkjet-coating method is the quickest and easiest to apply because of the use of an inkjet coating apparatus. A plurality of inkjet heads is used in an inkjet coating apparatus to jet polyimide liquid onto the substrates.

Figure 1A:
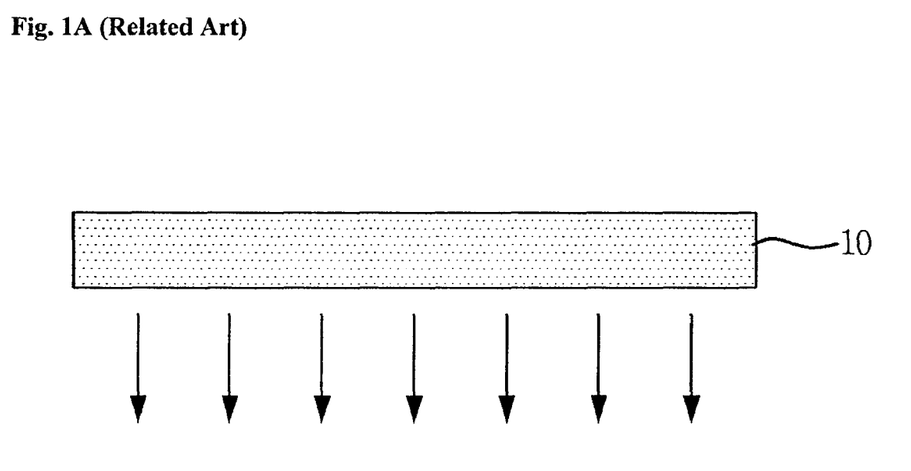
FIG. 1A and FIG. 1B are views illustrating an accumulation problem in an apparatus for coating a polyimide layer according to the related art.
Figure 1B:
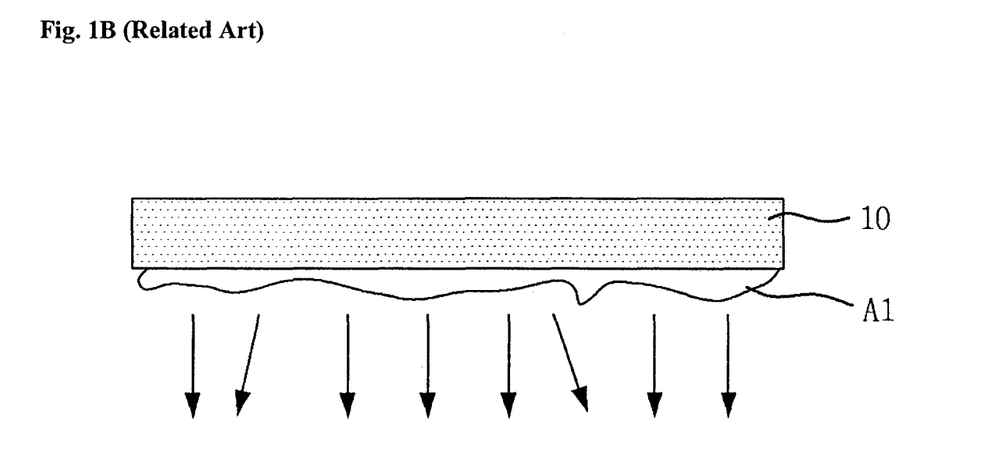

FIG. 1A and FIG. 1B are views illustrating an accumulation problem in an apparatus for coating a polyimide layer according to the related art. More specifically, FIG. 1A and FIG. 1B are schematic views illustrating the resultant shapes of the inkjet head 10 before and after jetting polyimide liquid onto the substrates in the inkjet-coating method according to the related art. The inkjet head 10 moves in a predetermined direction above a print table on which a target substrate is placed while jetting polyimide liquid onto the target substrate, thereby coating a polyimide layer onto the substrate. As shown in FIG. 1A, when the jetting surface of the inkjet head 10 is clean and does not have any residue thereon, polyimide liquid can be jetted uniformly so that a polyimide layer having uniform thickness can be formed on the substrate. However, as shown in FIG. 1B, polyimide liquid residue can accumulate on the jetting surface A1 of the inkjet head 10 even after only one inkjet coating process.

The accumulated polyimide liquid residue on the jetting surface of the inkjet head 10 interferes with jetting of the polyimide liquid during a subsequent inkjet coating process. Thus, a non-uniform polyimide layer may be coated on a substrate or, in extreme cases, no polyimide layer is coated on a substrate. The non-uniform polyimide layer can include pinhole faults and/or line blemishes. Even if the jetting surface of the inkjet head is cleaned using a cleaning bar, polyimide residue may still remain on the inkjet head.

SUMMARY OF THE INVENTION

Accordingly, embodiments of the invention is directed to an apparatus and method for coating a polyimide layer that substantially obviates one or more of the problems due to limitations and disadvantages of the related art.

An object of embodiments of the invention is to provide an apparatus and method for coating a polyimide layer that prevents pinhole faults and line blemishes from occurring in the polyimide layer.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, an apparatus for coating a polyimide layer includes a print table for receiving a substrate thereon, an inkjet head positioned over the print table and having a jetting surface with a plurality of nozzles for jetting polyimide liquid onto the substrate, and a polyimide liquid supply tank for supplying polyimide liquid, and a wiper movable from one side of the jetting surface to an other side of the jetting surface while the wiper contacts the jetting surface of the inkjet head.

In another aspect of the invention, a method for coating a polyimide layer includes placing a substrate on a print table, jetting polyimide liquid onto the substrate from a jetting surface provided over the print table, and wiping the jetting surface by moving a wiper from one side of the jetting surface to an other side of the jetting surface while the wiper contacts the jetting surface.

In yet another aspect, an apparatus for coating a polyimide layer includes a print table for receiving a substrate thereon, an inkjet head positioned over the print table and having a jetting surface with a plurality of nozzles for jetting polyimide liquid onto the substrate, and a polyimide liquid supply tank for supplying polyimide liquid, a cleaning solution for removing cured or uncured polyimide, and a wiper movable from one side of the inkjet head to an other side of the inkjet head while the wiper contacts the jetting surface of the inkjet head and rotatable so as to dip into the cleaning liquid.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention. In the drawings.

DETAILED DESCRIPTION OF THE PREFERRED EMBODIMENTS

Reference will now be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

Figure 2:
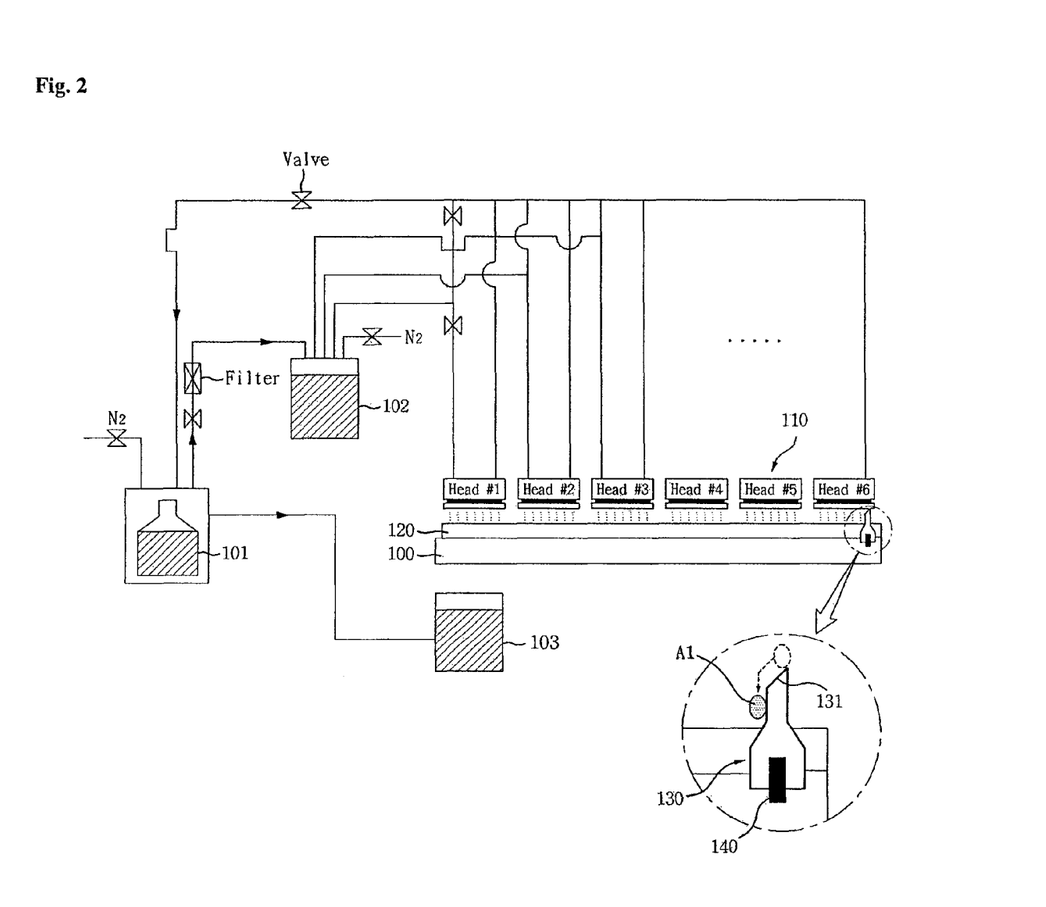
FIG. 2 is a schematic view illustrating an apparatus for coating a polyimide layer according an embodiment of the invention.

FIG. 2 is a schematic view illustrating an apparatus for coating a polyimide layer according an embodiment of the invention. As shown in FIG. 2, the apparatus for coating a polyimide layer according to an embodiment of the invention includes a print table 100, an inkjet head 110, a polyimide liquid supply tank 102, and a wiper 130. More specifically, the polyimide layer coating apparatus has the print table 100 on which the substrate 120 to be coated with a polyimide layer is placed and fixed. The substrate 120 can either be a color filter substrate or a thin film transistor array substrate of an LCD device.

A plurality of inkjet heads 110 are arranged in parallel with each other over the substrate 120, and each inkjet head 110 is connected to the polyimide liquid supply tank 102. The polyimide liquid supply tank 102 receives polyimide liquid from a pressure tank 101, and supplies the polyimide liquid to the inkjet head 110 at a predetermined constant pressure and flow rate. Polyimide liquid has the advantage of being heat resistant, chemically stable and high reliability.

A gas connection pipe provides nitrogen $N_2$ to the pressure tank 101. A polyimide liquid recovery connection pipe provides polyimide liquid recovered from the inkjet head to the pressure tank 101. A polyimide supply connection pipe through which polyimide liquid is provided to the polyimide supply tank 102 through a filter that is connected to the pressure tank 101. A back pressure supply connection pipe for providing back pressure to a cleaning liquid supply tank 103 is also connected to the pressure tank 101. Further, each connection pipe is provided with a valve for controlling amount of the content passing through the connection pipes and the pressure in the connection pipes.

A jetting surface of each inkjet head 110, which faces the substrate 120, is provided with a plurality of nozzles 111 for jetting the polyimide liquid therethrough. The inkjet head 110 scans over the substrate 120 while jetting the polyimide liquid onto the substrate 120, thereby forming a polyimide layer on the substrate 120. After jetting the polyimide layer onto the substrate, the jetting surface of the inkjet head 110 is wet with the polyimide liquid. The polyimide liquid remaining on the jetting surface of the inkjet head 110 is then removed through a wiping method. Accordingly, the jetting surface of the inkjet head is maintained in a state such that polyimide liquid can be jetted uniformly.

The wiper 130 is installed so as to move from one side of the print table 100 to the other side of the print table 100 while contacting the wiper to jetting surfaces of the inkjet heads 110, thereby performing wiping operations. The wiper 130 is made of one of a perfluoro-based polymer or silicone-based polymer. A surface of the wiper 130, which comes into contact with the jetting surfaces of the inkjet heads 110 during the wiping operation, is inclined with a predetermined inclination angle. Accordingly, polyimide liquid residue A1 remaining on the wiper after performing the wiping operation flows down along the inclined surface 131, so that the wiper 130 can keep the nozzles 111 in a clean state.

The apparatus for a coating a polyimide layer according to an embodiment of the invention may include a cleaning liquid supply tank 103 for holding cleaning liquid therein and for supplying cleaning liquid used to clean the wiper 130. For example, after finishing the wiping operation, the wiper 130 rotates on a support 140 so that the wiper 130 can be dipped into the cleaning liquid and then is returned to its original position. The cleaning liquid may be made of N-Methyl pyrrolidone (NMP), which is an imide-based polar solvent.

The wiper 130 is dipped into the cleaning liquid by rotating the wiper 130 in a first direction from the original position, and then is returned to the original position by rotating the wiper 130. The cleaning liquid may be made of N-Methyl pyrrolidone (NMP), which is an imide-based polar solvent in a second direction back to the original position. For example, the first direction in which the wiper 130 is dipped into the cleaning liquid is the counter-clockwise direction. By rotating the wiper 130 in the counter-clockwise direction, a first surface (upper surface) of the wiper 130, which was contacting the jetting surfaces of the inkjet heads 110, becomes upside down, so that the first surface of the wiper 130 faces down into the cleaning solution. The second direction in which the wiper 130 is returned to the original position is the clockwise direction. By subsequently rotating the wiper 130 in the clockwise direction, the first surface (upper surface) of the wiper 130 can contact the jetting surfaces of the inkjet heads 110.

After finishing the wiping operation, polyimide liquid remaining on the wiper 130 is removed by the wiper 130 being dipped into or sprayed by the cleaning liquid from the cleaning liquid supply tank 103. Any residual polyimide residue or cleaning liquid on the wiper 130 can naturally run-off the inclined surface 131 of the wiper 130 due to gravity. Further, the wiper can be dipped more than one time after a wiping operation.

The polyimide liquid supply tank 102 and the cleaning liquid supply tank 103 can structured such that they respectively receive the polyimide liquid in a polyimide liquid filled vessel and a cleaning liquid filled vessel, which expel their contents in response to an external gas pressure. Accordingly, the polyimide liquid supply tank 102 and the cleaning liquid supply tank 103 can be a single tank that receives both the polyimide liquid vessel and the cleaning liquid vessel.

Figure 3:
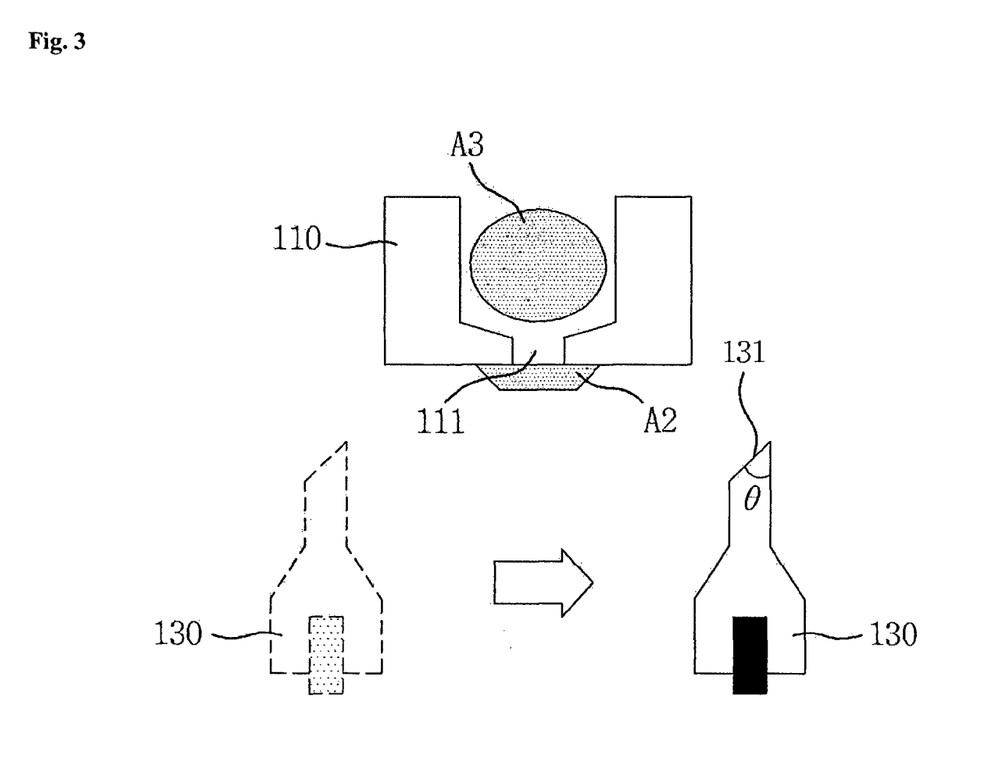
FIG. 3 is a view for showing the movement of a wiper shown in FIG. 2.

FIG. 3 is a view for showing the movement of a wiper shown in FIG. 2. If the inkjet head 110 jets polyimide liquid through nozzles 111 of a jetting surface, polyimide liquid residue A2 remains on the jetting surface of the inkjet head 110, as shown in FIG. 2. Subsequently, the wiping operation in which the inclined surface of the wiper 130 wipes off the jetting surface of the inkjet head 110 is performed to remove the polyimide liquid residue A2.

If the residue on the wiper 130 naturally runs off the inclined wiping surface 131 of the wiper 130 due to gravity, the wiper 130 can maintain a clean state after performing the wiping operation. However, if polyimide residue remains on the surface of wiper 130 after performing the wiping operation, the inkjet head 110 cannot be neatly cleaned off during the next wiping operation. As a result, the inkjet head 110 cannot jet polyimide uniformly onto the entire surface of the substrate. Accordingly, the wiper 130 should be maintained in a clean state. Embodiments of the invention can solve the problem in which the wiper is contaminated during wiping operations, without the need of special process steps or additional structures by using the wiper 130 with an inclined wiping surface.

Figure 4:
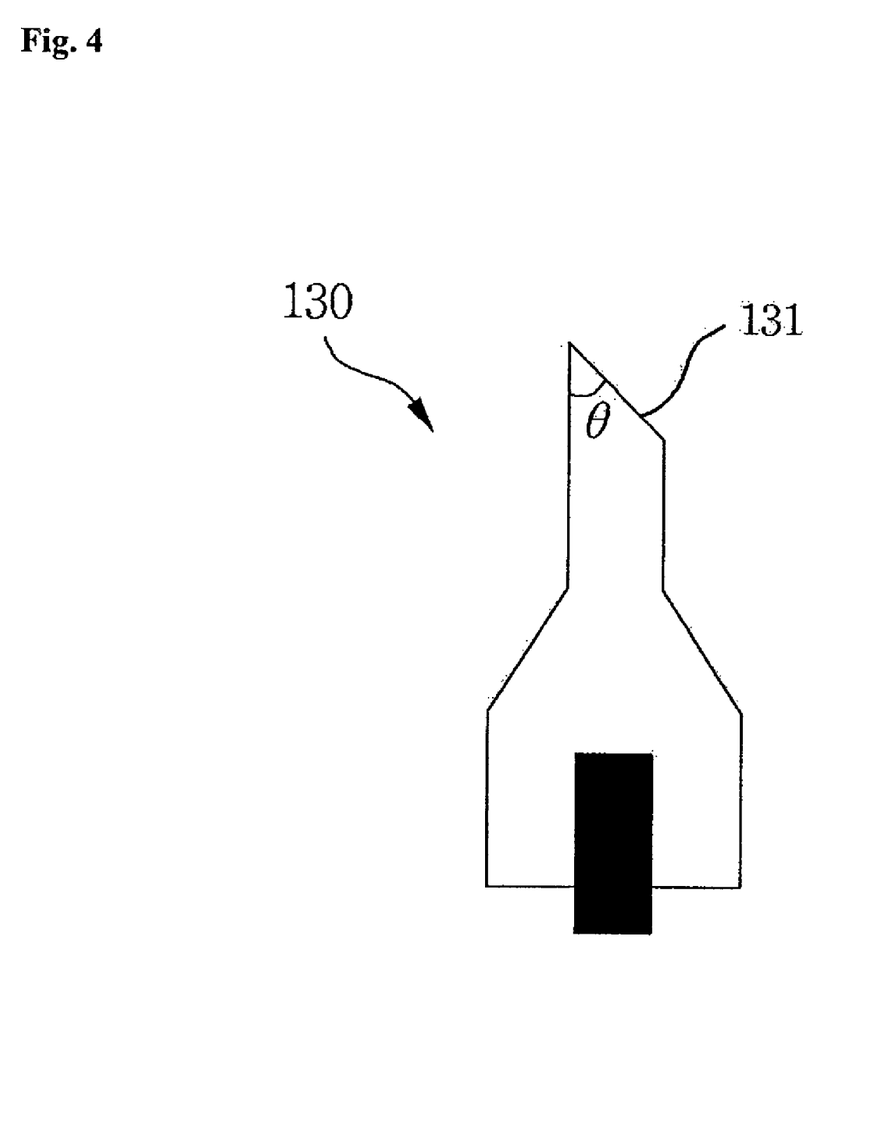
FIG. 4 is a view illustrating an example of the wiper shown in FIG. 2.

FIG. 4 is a view illustrating an example of the wiper shown in FIG. 2. The inclined wiping surface 131 of the wiper 130 is structured in such a manner that it is easy to wipe off the jetting surfaces of the inkjet heads 110 such that the residue on the inclined wiping surface 131 can easily flow down. As shown in FIG. 4, the wiper 130 is structured to have a wiping surface with an inclination sloped down from one side to the other side. An inclination angle θ of the inclined surface of the wiper 120 is in the range of about 20 to 70 degrees.

Figure 5:
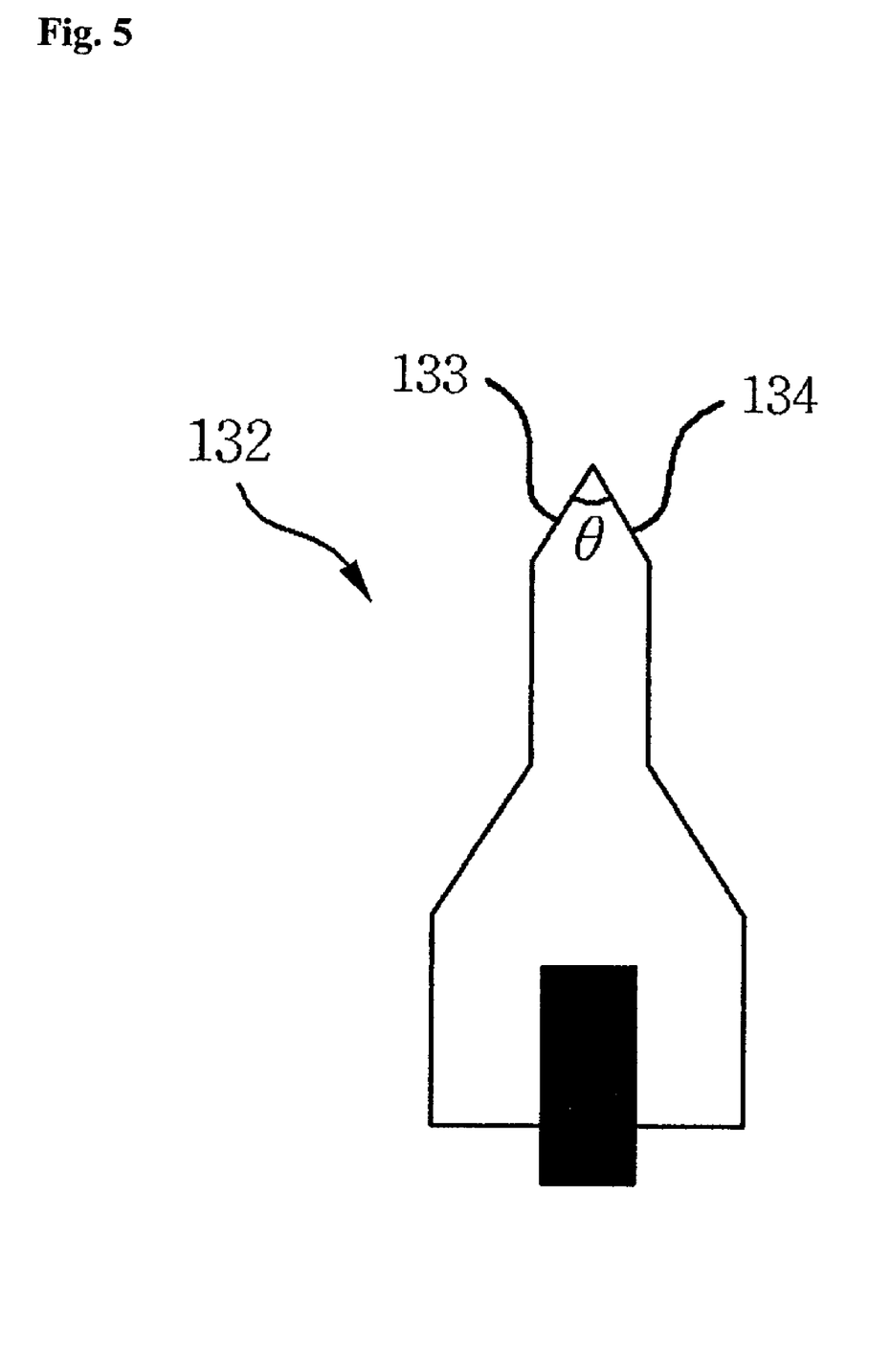
FIG. 5 is a view illustrating another example of the wiper shown in FIG. 2.

FIG. 5 is a view illustrating a modified example of the wiper shown in FIG. 2. As shown in FIG. 5, the wiper 132 can have a first inclined wiping surface 133 and a second inclined wiping surface 134. The first inclined wiping surface 133 and a second inclined wiping surface 134 intersect at the center of the wiper 132. In this instance, an inclination angle θ between the first inclined surface 133 and the second inclined surface 134 can be in the range of about 40 to 140 degrees so that polyimide liquid residue can naturally flow down due to gravity.

Figure 6:
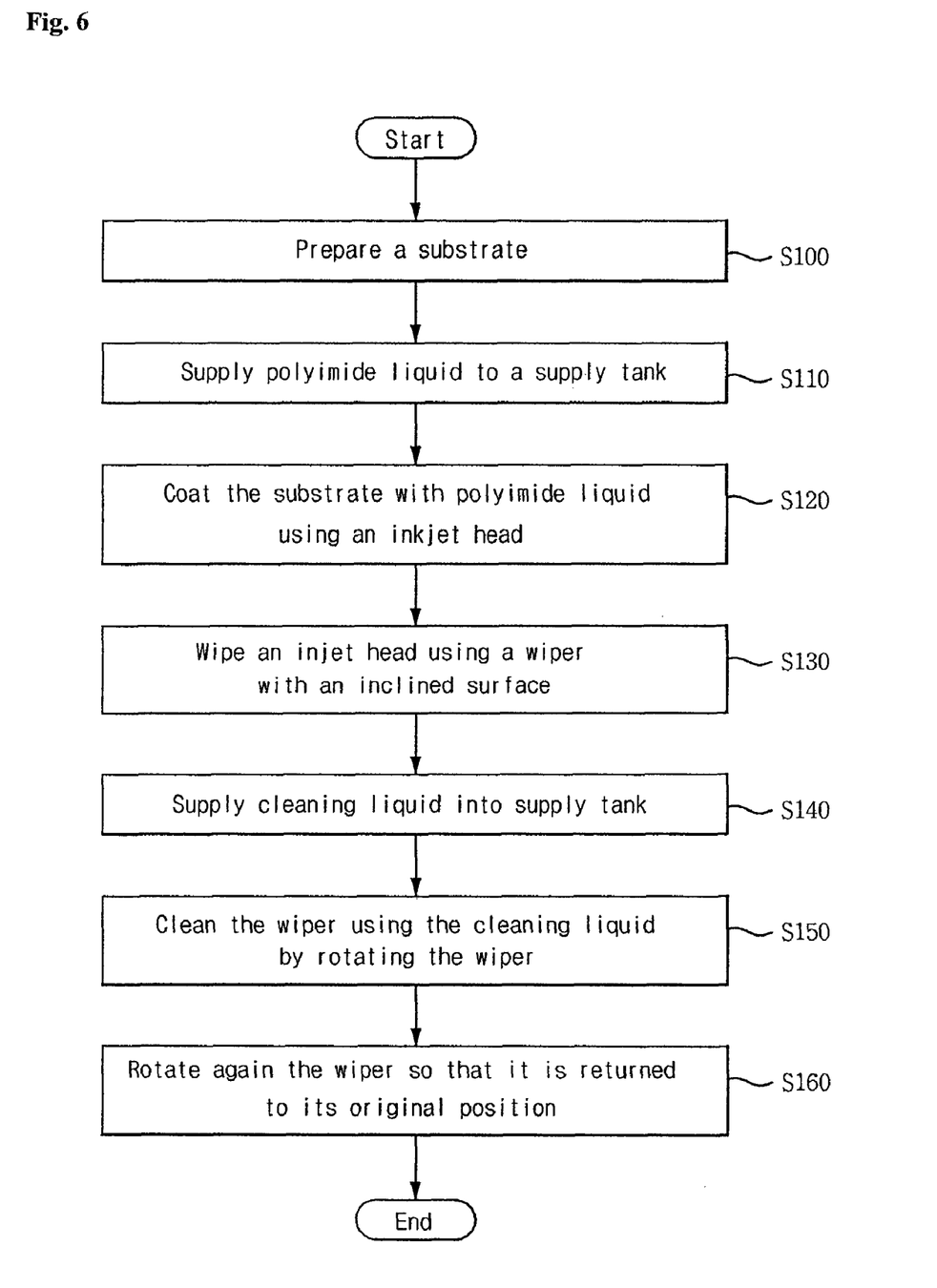
FIG. 6 is a flow chart illustrating a method for coating a polyimide layer according to an embodiment of the invention using the apparatus for coating a polyimide layer shown in FIG. 2.

FIG. 6 is a flow chart illustrating a method for coating a polyimide layer according to an embodiment of the invention using the apparatus for coating a polyimide layer shown in FIG. 2. First, the substrate 120 is placed and then fixed on the print table 100, as describe in step S100 of FIG. 6. The substrate 120 can either be a thin film transistor array substrate or a color filter substrate of an LCD device.

Next, the polyimide liquid vessel filled with polyimide liquid is loaded into the polyimide liquid supply tank 110, as indicated in step S110 of FIG. 6.

Next, the polyimide liquid is supplied to the inkjet head 110 installed over the print table 100, and then distributed on the substrate 120 through the nozzles 111 provided in the jetting surfaces of the inkjet heads 110, as indicated in step S120 of FIG. 6.

Next, the inclined wiping surface 131 of the wiper 130 moves across the jetting surfaces of the inkjets 110 while contacting the jetting surfaces of the inkjets 110 to wipe off the nozzles 111 of the inkjet heads 110, as indicated in step S130 of FIG. 6. After finishing the wiping operation, polyimide liquid residue A1 remaining on the wiper 130 flows down along the inclined surface 131 of the wiper 130.

The method for coating a polyimide layer according to the embodiment of the invention can also include steps S140 through S160 shown in FIG. 6 to maintain the wiper 130 in a clean state. In steps S140 and S150, the cleaning liquid vessel filled with cleaning liquid is loaded into the cleaning liquid supply tank 103, and then the wiper 130 is rotated by the support bar 140 to be dipped into the cleaning liquid or sprayed by the cleaning liquid so that the wiper 130 is cleaned. The cleaning liquid can be N-Methyl pyrrolidone, which is imide-based polar solvent, to remove both cured and uncured polyimide liquid. Since the wiper 130 has the inclined surface 131 as shown in FIG. 3 through FIG. 5, residue on the wiper 130 can be easily removed. That is, the inclined wiping surface(s) of the wiper can be structured to be sloped down or sloped up in one direction as shown in FIG. 3 and FIG. 4, or to be sloped in two directions as shown in FIG. 5.

In step S160, the wiper 130 is rotated to be returned to its original position. Any polyimide liquid and/or cleaning liquid remaining on the inclined surface of the wiper 130 can run off due to gravity.

As described above, embodiments of the invention adopt a wiper 130 having an inclined wiping surface to wipe off the inkjet head of the polyimide layer coating apparatus using the inkjet method. As a result, the wiper can be maintained in clean state so as to maintain the jetting efficiency of the inkjet head. Since polyimide liquid residue on the inkjet head can be effectively prevented for a polyimide layer coating process using an inkjet method, pinhole faults or line blemish problems in the polyimide layers can be prevented.

It will be apparent to those skilled in the art that various modifications and variations can be made in an apparatus and method for coating a polyimide layer of embodiments of the invention without departing from the spirit or scope of the invention. Thus, it is intended that embodiments of the invention cover the modifications and variations of this invention provided they come within the scope of the appended claims and their equivalents.

What is claimed is:

1. A method for coating a polyimide layer, comprising:
   placing a substrate on a print table;
   arranging a plurality of inkjet heads in parallel with each other over the substrate, each of the inkjet heads having a jetting surface with a plurality of nozzles;
   jetting polyimide liquid onto the substrate from the nozzles while scanning the inkjet heads over the substrate;
   wiping the jetting surfaces of the inkjet heads by moving a wiper from a first one of the inkjet heads to a last one of the inkjet heads along the print table while the wiper contacts the jetting surfaces so that a residue on the jetting surfaces is removed; and
   rotating the wiper on a supporter so that the wiper is dipped into a cleaning liquid in a cleaning liquid supply tank after finishing the wiping operation, thereby removing a residue on the wiper,
   wherein the supporter supports the wiper.

2. The method for coating a polyimide layer according to claim 1, wherein the wiper has an inclined wiping surface in contact with the jetting surface of the inkjet head.

3. The method for coating a polyimide layer according to claim 2, wherein the wiper has an inclined wiping surface with an inclination angle in a range of about 20 to 70 degrees.

4. The method for coating a polyimide layer according to claim 1, wherein the wiper includes a first inclined wiping surface and a second inclined wiping surface that intersect at the center of the wiper.

5. The method for coating a polyimide layer according to claim 4, wherein an inclination angle between the first inclined wiping surface and the second inclined wiping surface is in a range of about 40 to 140 degrees.

* * * * *